United States Patent
Pisasale et al.

(10) Patent No.: US 10,466,733 B2
(45) Date of Patent: *Nov. 5, 2019

(54) APPARATUSES AND METHODS FOR POWER REGULATION BASED ON INPUT POWER

(71) Applicant: MICRON TECHNOLOGY, INC., Boise, ID (US)

(72) Inventors: Michelangelo Pisasale, Catania (IT); Maurizio Giovanni Gaibotti, Cesano Maderno (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/109,559

(22) Filed: Aug. 22, 2018

(65) Prior Publication Data
US 2018/0364750 A1    Dec. 20, 2018

Related U.S. Application Data

(63) Continuation of application No. 15/617,244, filed on Jun. 8, 2017, now Pat. No. 10,088,862, which is a
(Continued)

(51) Int. Cl.
*G05F 3/26* (2006.01)
*H03K 17/30* (2006.01)
(Continued)

(52) U.S. Cl.
CPC ............. *G05F 3/26* (2013.01); *H03K 17/10* (2013.01); *H03K 17/12* (2013.01); *H03K 17/30* (2013.01); *H03K 19/003* (2013.01)

(58) Field of Classification Search
CPC .......... G05F 3/26; H03K 17/10; H03K 17/12; H03K 17/30; H03K 19/003
See application file for complete search history.

(56) References Cited

U.S. PATENT DOCUMENTS

| | | | | |
|---|---|---|---|---|
| 5,440,258 A | * | 8/1995 | Galbi | H03K 19/00384 327/112 |
| 7,570,088 B1 | * | 8/2009 | Ku | H03K 19/00315 327/112 |

(Continued)

OTHER PUBLICATIONS

Kossel, Marcel et al., "A DDR3/4 Memory Link TX Supporting 24-40 Ω, 0.8-1.6 V, 0.8-5.0 Gb/s With Slew Rate Control and Thin Oxide Output Stages in 22-NM CMOS SOI", IEEE, Nov. 2014, pp. 135-138.

*Primary Examiner* — Yusef A Ahmed
*Assistant Examiner* — Lakaisha Jackson
(74) *Attorney, Agent, or Firm* — Dorsey & Whitney LLP (57) ABSTRACT

Apparatuses and methods for power regulation based on input power using circuitry are disclosed herein. An example apparatus may include a reference circuit configured to receive a first voltage and a second voltage and to provide an output reference voltage at an output node having a value equal to the second voltage subtracted from the first voltage. The reference circuit may be configured to mirror a current of a first circuit coupled between the second voltage and a reference voltage through a second circuit coupled between the first voltage and the output node. The example apparatus may further include a power circuit configured to provide a third voltage based on the output reference voltage. The third voltage may have a value that is equal to the output reference voltage.

20 Claims, 5 Drawing Sheets

Related U.S. Application Data continuation of application No. 14/866,152, filed on Sep. 25, 2015, now Pat. No. 9,678,524.

(51) Int. Cl.
*H03K 17/10* (2006.01)
*H03K 17/12* (2006.01)
*H03K 19/003* (2006.01)

(56) References Cited

U.S. PATENT DOCUMENTS

| | | | |
|---|---|---|---|
| 9,678,524 B2 | 6/2017 | Pisasale et al. | |
| 2004/0056700 A1* | 3/2004 | Amick | H03K 19/0013 327/333 |
| 2006/0087260 A1* | 4/2006 | Herzer | H03K 17/063 315/291 |
| 2009/0195267 A1* | 8/2009 | Ho | H03K 17/102 326/68 |
| 2014/0028356 A1* | 1/2014 | Knoedgen | H02M 1/32 327/108 |
| 2014/0097888 A1* | 4/2014 | Lee | H02M 3/155 327/537 |

\* cited by examiner

APPARATUSES AND METHODS FOR POWER REGULATION BASED ON INPUT POWER

CROSS-REFERENCE TO RELATED APPLICATION

This application is a continuation of U.S. patent application Ser. No. 15/617,244 filed Jun. 8, 2017, which application is a continuation of U.S. patent application Ser. No. 14/866,152, filed Sep. 25, 2015 and issued as U.S. Pat. No. 9,678,524 on Jun. 13, 2017. The aforementioned applications and issued patent are incorporated herein by reference, in their entirety, for any purpose.

BACKGROUND

As electronic devices continue to evolve, there is a constant tension between size, speed, and power consumption. In some cases, electronic devices include internal logic circuitry that operates at a lower voltage than externally coupled circuitry. However, when communicating with the externally coupled circuitry, internal components may be required in the output circuitry working at the same or higher voltage than the externally coupled circuitry. Such output circuitry components may require more space and consume more power than the internal circuitry, making it challenging to stay within power specifications.

DETAILED DESCRIPTION

Apparatuses and methods for power regulation based on input power are disclosed herein. Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
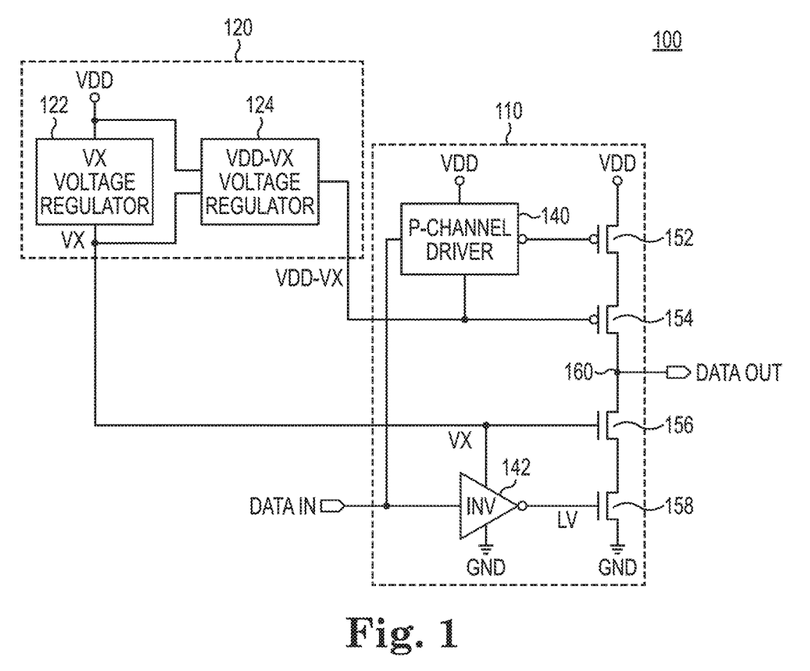
FIG. 1 is a block diagram of an apparatus including an output buffer and a power regulator circuit according to an embodiment of the disclosure.

FIG. 1 is a block diagram of an apparatus 100 (e.g., an integrated circuit, a memory device, a memory system, an electronic device or system, a smart phone, a tablet, a computer, a server, etc.) including a output buffer 110 coupled to a power regulator circuit 120. The output buffer 110 may be configured to receive an input data signal DATA IN and to provide an output data signal DATA OUT from node 160. In some embodiments, the output buffer 110 may be a cascode output buffer that includes p-type transistors 152 and 154 on the high side (e.g., coupled between the node 160 and a supply voltage, such as VDD), and n-type transistors 156 and 158 on the low side (e.g., coupled between the node 160 and a reference voltage, such as ground GND). The output buffer 110 may further include a p-channel driver circuit 140 configured to provide a voltage to the gate of the transistor 152 based on a value of the DATA IN signal, and include an inverter 142 configured to provide a voltage to the gate of the transistor 158 based on the DATA IN signal.

The power regulator circuit 120 may include a VX voltage regulator 122 and a VDD-VX voltage regulator 124. The VX voltage regulator 122 may configured to be coupled to a supply voltage, such as VDD (e.g., a first voltage) and may provide a stepped down voltage VX (e.g., a second voltage). The VX voltage may be a lower voltage used to drive circuitry of the apparatus 100. The VX voltage regulator 122 may be a direct current to direct current (DC/DC) voltage regulator, in some embodiments. The VX voltage may be provided to the gate of the transistor 156 and to the inverter 142. The VDD-VX voltage regulator 124 may receive the VDD voltage and the VX voltage, and may provide a VDD-VX voltage (e.g., a third voltage) that is the difference between the supply voltage VDD and the VX voltage. The VDD-VX voltage may be provided to the gate of the transistor 154 and to the low side of the p-channel driver circuit 140.

The apparatus 100 may include components configured to provide, in operation, a DATA OUT signal to externally coupled circuitry that operates at a higher voltage differential (e.g., VDD voltage to a reference voltage GND) than other components (e.g., operating between the VX voltage and the GND voltage) of the apparatus 100, such as transistors 152, 154, 156, and 158 of the output buffer 110 or circuitry of the power regulator circuit 120. For example, the VX voltage regulator 122 may receive the VDD voltage, and may provide the VX voltage. In some examples, the VDD voltage may be 3 volts and the VX voltage may be 1.8 volts. The VDD-VX voltage regulator 124 may receive the VDD voltage and the VX voltage and may provide the VDD-VX voltage using current mirror circuits.

As previously described, in some embodiments the output buffer 110 may be a cascode output buffer. The transistor 154 may be activated based on the VDD-VX signal received at its gate and the transistor 156 may be activated responsive to the VX signal received at its gate. In other embodiments, the output buffer 110 may be a non-cascode buffer, and the transistor 154 and the transistor 156 may be omitted, such that the transistor 152 and the transistor 158 are each coupled directly to the node 160. The p-channel driver circuit 140 may receive the DATA IN signal, the VDD voltage, and the VDD-VX voltage. The p-channel driver circuit 140 may provide either the VDD voltage or the VDD-VX voltage to the gate of the transistor 152 based on a value of the DATA IN signal. For example, if the DATA IN signal is a high logical value, the p-channel driver circuit 140 may provide the VDD signal to the gate of the transistor 152 to deactivate the transistor 152. Further, if the DATA IN signal is a low logical value, the p-channel driver circuit 140 may provide the VDD-VX signal to the gate of the transistor 152 to activate the transistor 152 to provide the VDD voltage to the node 160.

The inverter 142 may receive the DATA IN signal, the VX voltage, and the GND voltage. The inverter 142 may provide either the VX voltage or the GND voltage to the gate of the transistor 158 based on a value of the DATA IN signal. For example, if the DATA IN signal is a high logical value, the inverter 142 may provide the GND signal (e.g., invert the logical value) to the gate of the transistor 158 to deactivate the transistor 158. Further, if the DATA IN signal is a low logical value, the inverter 142 may provide the VX signal to the gate of the transistor 158 to activate the transistor 158.

By using the VDD and VDD-VX voltages having a VX voltage differential to drive the high side of the output buffer 110, and by using the VX and GND voltages having a VX differential to drive the low side of the output buffer, the output buffer 110 may be implemented using similar circuitry as other circuitry of the apparatus 100 that operate using the VX voltage. That is, none of the components of the output buffer 110 are ever exposed to a voltage drop higher than VX. Further, by basing the output signal from the VDD-VX voltage regulator 124 on the VDD voltage, rather than driving to a fixed voltage based on an assumed VDD voltage, the VDD-VX voltage may automatically follow changes to the VDD voltage, which may improve reliability and robustness of the apparatus 100. Circuitry of the output buffer 110 and the power regulator circuit 120 may meet standby power requirements assigned to the apparatus 100, and may be capable of achieving switching speeds required of flash memory, such as at least 166 MHz. Such circuitry suited to operate using the VX voltage may require smaller real estate than circuitry operating at the external voltage, e.g. VDD, therefore reducing the overall apparatus cost. For example, the output buffer 110, and more generally the apparatus 100, may work correctly in an extended supply voltage range, possibly matching non-overlapping supply voltage specification ranges, such as 1.8V+/−10% and 3.0V+/−10%.

Figure 2:
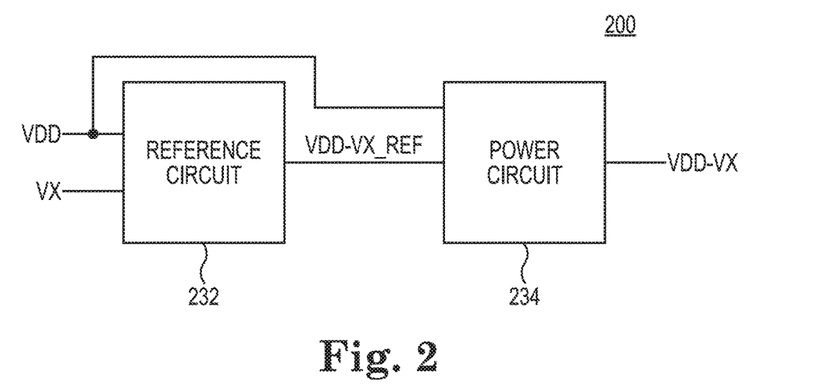
FIG. 2 is a block diagram of a power regulator circuit according to an embodiment of the disclosure.

FIG. 2 is a block diagram of a VDD-VX voltage regulator 200 according to an embodiment of the disclosure. The VDD-VX voltage regulator 200 may be implemented in the VDD-VX voltage regulator 124 of FIG. 1. The VDD-VX voltage regulator 200 may include a reference circuit 232 coupled to a power circuit 234. The reference circuit 232 may receive a VDD voltage and a VX voltage, and provide a VDD-VX_REF voltage. The power circuit 234 may receive the VDD-VX_REF voltage and the VDD voltage, and provide a VDD-VX voltage.

In operation, the reference circuit 232 may provide a VDD-VX_REF voltage based on the VDD and VX voltages. The reference circuit 232 may include current mirror circuits and matching transistors to generate the VDD-VX_REF voltage. The power circuit 234 may provide the VDD-VX voltage based on the VDD-VX_REF voltage and the VDD voltage. The power circuit 234 may include a voltage amplifier, a voltage-to-current converter, and a current multiplier to increase responsiveness of the VDD-VX voltage to spikes in demand, which may be necessary when driving an output buffer at higher frequencies, such as 166 MHz or greater. In some examples, the power circuit 234 may be disabled during a standby mode, and the reference circuit 232 may provide the VDD-VX_REF via a resistive line to hold the voltage at the VDD-VX node at a nominal value.

Figure 3:
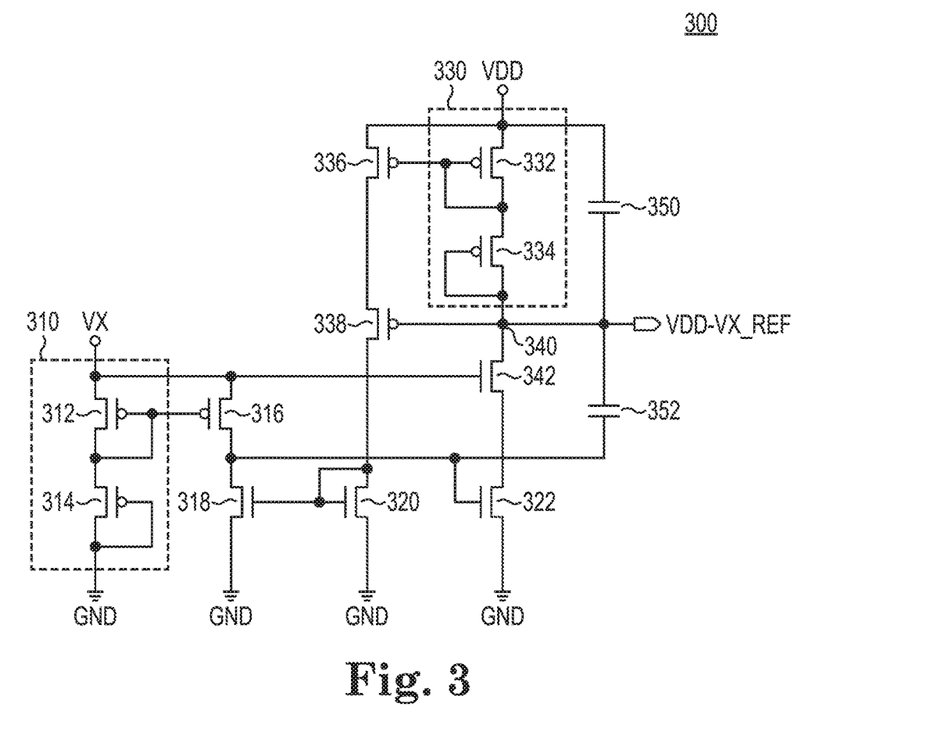
FIG. 3 is a schematic diagram of a reference circuit according to an embodiment of the disclosure.

FIG. 3 is a schematic diagram of a reference circuit 300 according to an embodiment of the disclosure. The reference circuit 300 may be implemented in the VDD-VX voltage regulator 124 of FIG. 1 and/or the reference circuit 232 of FIG. 2. The reference circuit 300 may include a first circuit 310 that is matched with a second circuit 330. That is, a voltage drop across the first circuit 310 is approximately the same as a voltage drop across the second circuit 330. The reference circuit 300 is configured to generate a VDD-VX_REF voltage (e.g., output reference voltage) that represents the same voltage drop from VDD as the voltage drop from a VX voltage to a GND voltage. The first circuit 310 may include p-type transistors 312 and 314, and the second circuit 330 may include p-type transistors 332 and 334. The reference circuit 300 may further include p-type transistors 316, 336, and 338; and n-type transistors 318, 320, 322, and 342. The reference circuit 300 may additionally include capacitor 350 and capacitor 352.

A source of the transistor 312 may be coupled to a VX voltage source (e.g., the VX voltage regulator 122 of FIG. 1) and a drain of the transistor 312 may be coupled to a source of the transistor 314. A drain of the transistor 314 may be coupled to the GND voltage. Thus, the voltage drop across transistors 312 and 314 is the VX voltage. The drain of the transistor 312 is also coupled to the gate of the transistor 312 and the gate of the transistor 316 to mirror the current through the transistor 316 and the transistor 318. The drain of the transistor 314 is also coupled to the gate of the transistor 314 to form a voltage clamp circuit.

A source of the transistor 316 may be coupled to the VX voltage source and a drain may be coupled to a drain of the transistor 318. A source of the transistor 318 may be coupled to the GND voltage. Thus, the voltage drop across the transistors 316 and 318 is the VX voltage. The transistor 318 and the transistor 320 may form another mirror circuit with both gates coupled together and to a drain of the transistor 320, such that the current through the transistor 320 is mirrored through the transistor 318. The source of the transistor 320 may be coupled to the GND voltage.

A source of the transistor 332 may be coupled to the VDD voltage and a drain may be coupled to a source of the transistor 334. A drain of the transistor 334 may be coupled to a node 340, which provides the VDD-VX_REF voltage. The voltage drop across the transistors 332 and 334 of the second circuit is the VX voltage. A drain of the transistor 332 is also coupled to a gate of the transistor 332 and a gate of the transistor 336 to mirror the current through the transistor 336, the transistor 338, and the transistor 320. The drain of the transistor 334 is coupled to the gate of the transistor 334 to form a voltage clamp circuit.

A source of the transistor 336 may be coupled to the VDD voltage and the drain may be coupled to a source of the transistor 338 to form a cascode driver circuit. A drain of the transistor 338 may be coupled to a drain of the transistor 320, and a gate of the transistor 338 may be coupled to the node 340.

The transistor 342 and the transistor 322 may form a cascode driver circuit. A drain of the transistor 342 may be coupled to the node 340, and a source may be coupled to a drain of the transistor 322. A source of the transistor 322 may be coupled to the GND voltage. A gate of the transistor 342 may be coupled to the VX voltage source and a gate of the transistor 322 may be coupled to a node between the transistor 316 and the transistor 318 to provide feedback.

The capacitor 350 may be coupled in parallel with the second circuit 330 between the VDD and the node 340 to form a tank circuit. The capacitor 352 may be coupled between the node 340 and the node between the transistor 316 and the transistor 318 to achieve a stable frequency response.

In operation, the first circuit 310 and the second circuit 330 are matched such that a voltage drop across the first and second circuits 310, 330 is the same for a common current through each. Because the voltage drop through the first circuit 310 is the VX voltage, mirroring the current through the first circuit 310 to the second circuit 330 may provide a same voltage drop starting from a VDD voltage, such that the voltage at the drain of the transistor 334 is VDD-VX. For example, the current through the first circuit 310 is mirrored through the transistor 316 and the current through second circuit 330 is mirrored via the transistors 336, 338, and 320. The current through the transistor 320 is mirrored through the transistor 318. The transistor 322, which includes the gate coupled to the node between the transistor 316 and the transistor 318, throttles the current through the second circuit 330 such that the currents through the transistor 316 matches the current through the transistor 318. For example, if the current through the transistor 316 is higher than the current through the transistor 318, the voltage at the gate of the 322 will be higher, and will cause more current to be drawn through the transistor 322, and likewise through the second circuit 330. Conversely, if the current through the transistor 316 is lower than the current through the transistor 318, the voltage at the gate of the 322 will be lower, and will cause less current to be drawn through the transistor 322, and likewise through the second circuit 330. Thus, the transistor 322 will throttle the current through the second circuit 330 such that the current through the transistor 316 matches the current through the transistor 318, and likewise the current through the first circuit 310 matches the current through the second circuit 330. By mirroring the current through the first circuit 310 and the second circuit 330 and because of the common transistor sizes in the first circuit 310 and the second circuit 330, each of the first circuit 310 and the second circuit 330 experience a similar VX voltage drop. Thus, the VDD-VX_REF voltage at the node 340 may be equal to a VDD-VX voltage. The transistor 322 may provide feedback to improve reliability of the current mirroring, and the transistor 338 and the transistor 342 may be included to form respective cascode driver circuits with transistor 336 and transistor 322, respectively, for improved isolation. The capacitor 350 and the capacitor 352 may decrease noise in the VDD-VX_REF voltage provided at the output. Because the largest voltage drop across any of the transistors 312, 314, 316, 318, 320, 322, 332, 334, 336, 338, and 342 is the VX voltage, the same components may be used in the reference circuit 300.

Figure 4:
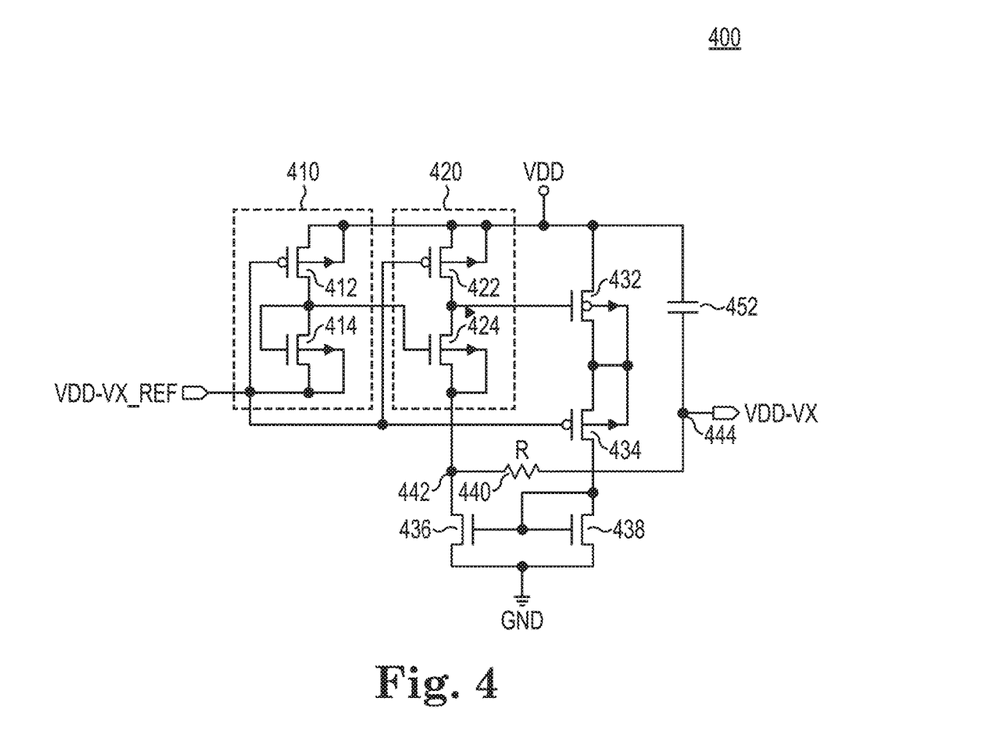
FIG. 4 is a schematic diagram of a power circuit according to an embodiment of the disclosure.

FIG. 4 is a schematic diagram of a power circuit 400 according to an embodiment of the disclosure. The power circuit 400 may be implemented in the VDD-VX voltage regulator 124 of FIG. 1 and/or the power circuit 234 of FIG. 2. The power circuit 400 may include a first circuit 410 and a second circuit 420 to form a voltage amplifier. The first circuit 410 may include a transistor 412 and a transistor 414, and the second circuit 420 may include a transistor 422 and a transistor 424. The power circuit 400 may further include p-type transistor 434, n-type transistors 432, 436 and 438, a resistor 440, and a capacitor 452.

A source of the transistor 412 may be coupled to a VDD voltage and a drain of the transistor 412 may be coupled to a drain of the transistor 414. A source of the transistor 414 may be coupled to a VDD-VX_REF voltage (e.g., from the reference circuit 232 of FIG. 2 and/or the reference circuit 300 of FIG. 3). A gate of the transistor 412 may be coupled to the VDD-VX_REF voltage, and a gate of the transistor 414 may be coupled to a drain of the transistor 414.

A source of the transistor 422 may be coupled to a VDD voltage and a drain of the transistor 422 may be coupled to a drain of the transistor 424. A source of the transistor 424 may be coupled to a node 442. A gate of the transistor 422 may be coupled to the VDD-VX_REF voltage, and a gate of the transistor 424 may be coupled to the drain of the transistor 414. The transistor 422 and the transistor 424 may be larger replicas of the transistor 412 and the transistor 414 (e.g., have larger transistor dimensions capable of providing greater current), respectively, to form a voltage amplifier. In some examples, the transistor 422 and the transistor 424 may be four times larger than the transistor 412 and the transistor 414, respectively.

A drain of the transistor 432 may be coupled to the VDD voltage and a source of the transistor 432 may be coupled to a source of the transistor 434. Together, the transistor 432 and the transistor 434 may act as a voltage to current converter. A drain of the transistor 434 may be coupled to a drain of the transistor 438. The drain of the transistor 438 may be coupled to the GND voltage. A gate of the transistor 432 may be coupled to the drain of the transistor 424. A gate of the transistor 434 may be coupled to the VDD-VX_REF voltage. A drain of the transistor 436 may be coupled to the source of the transistor 424 and a source of the transistor 436 may be coupled to the GND voltage. A gate of the transistor 436 may be coupled to a gate of the transistor 438. The transistor 436 may be larger than the transistor 438, to act as a current multiplier. For example, the transistor 436 may have larger transistor dimensions capable of providing greater current than the transistor 438. The resistor 440 may be coupled between the node 442 (e.g., a first output node) and the node 444 (e.g., a second output node) to isolate or decouple the second circuit 420 from the node 444 providing the VDD-VX voltage. The capacitor 452 may be coupled between the VDD voltage and the node 444 to filter out noise in the VDD-VX signal.

In operation, the power circuit 400 provides the VDD-VX voltage at an output based on a comparison of transistor 412 and transistor 414 of the first circuit 410 with transistor 422 and transistor 424 of the second circuit 420. The transistor 422 and transistor 424 of the second circuit 420, being larger, have a larger current capacity than the transistor 412 and transistor 414 of the first circuit 410. Thus, the second circuit 420 may operate as a voltage amplifier, and the amplified voltage may be based on a size different between the transistors 412 and 414 of the first circuit 410 and the transistors 422 and 424 of the second circuit. Because the second circuit 420 may amplify a voltage, the transistor 432 and the transistor 434 (e.g., acting as a voltage to current converter) and the transistor 436 and the transistor 438 (e.g., acting as a current multiplier), may draw the amplified voltage down, e.g., reduce the voltage, such that the voltage at the source of the transistor 424 (e.g., the node 442) is equal to the voltage at the source of the transistor 414 (e.g., the VDD-VX_REF voltage). Because the second circuit 420 is coupled in parallel with the capacitor 452, the voltages at the node 442 and the node 444 may each be equal to VDD-VX. The resistor 440 may isolate or decouple the node 442 (e.g., and the second circuit 420) from the node 444 to prevent coupling between the output and the second circuit 420.

Figure 5:
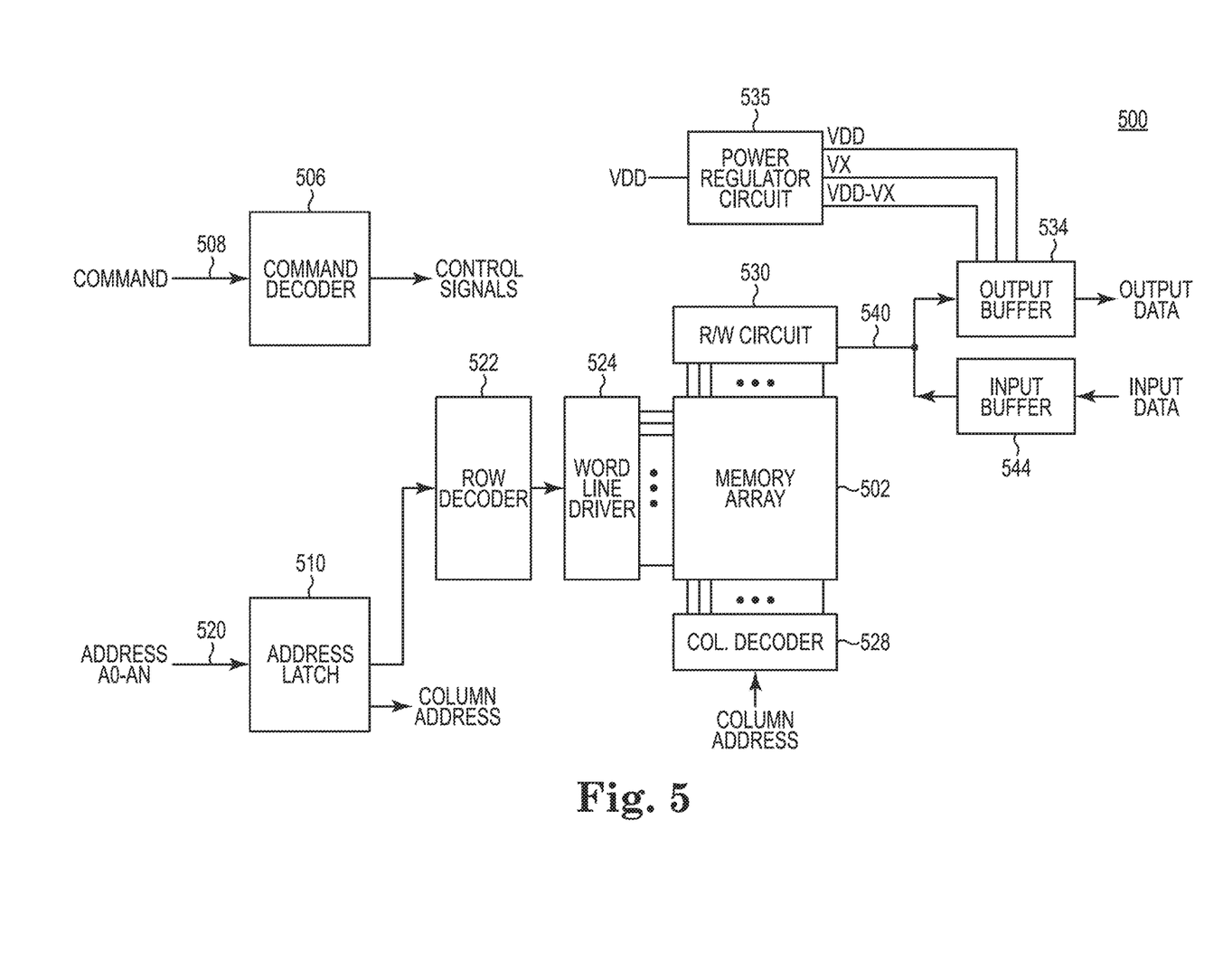
FIG. 5 is a block diagram of a memory according to an embodiment of the disclosure.

FIG. 5 is a block diagram of a memory 500 according to an embodiment of the disclosure. The memory 500 includes an array 502 of memory cells, which may be, for example, DRAM memory cells, SRAM memory cells, flash memory cells, or some other types of memory cells and may include any number of banks and/or sections of memory as described herein. The memory 500 includes a command decoder 506 configured to receive memory commands 508 through a CMD bus. The command decoder 506 may generate control signals based on the memory commands 508 received through the CMD bus. The memory 500 may also include an address latch 510 configured to receive address AO-AN signals 520 from an address bus. The address latch 510 may provide row and column addresses. The address latch then outputs separate column addresses and separate row addresses.

The row and column addresses are provided by the address latch 510 to a row address decoder 522 and a column address decoder 528, respectively. The column address decoder 528 selects columns of memory cells extending through the array 502 corresponding to respective column addresses. The row address decoder 522 is connected to word line driver 524 that activates respective rows of memory cells in the array 502 corresponding to received row addresses. The selected columns corresponding to a received column address are coupled to a read/write circuitry 530 to provide read data to a data output circuit 534 via an input-output data bus 540.

The memory 500 may include circuitry configured to operate at a lower voltage than an operating voltage of an output bus to drive the output data. For example, an output bus may be specified to operate between a VDD voltage and a reference voltage. The circuitry may be designed to operate between a VX voltage, which is less than the VDD voltage, and the reference voltage, such as GND voltage. A power regulator circuit 535 and the output buffer 534 may operate together to provide the output data using circuitry of the memory 500 by using the VDD-VX voltage along with the VDD, VX, and GND voltages. The power regulator circuit 535 may include the power regulator circuit 120 of FIG. 1, the VDD-VX voltage regulator 200 of FIG. 2, the reference circuit 300 of FIG. 3, the power circuit 400 of FIG. 4, or combinations thereof. Further, the output buffer 534 may include the output buffer 110 of FIG. 1. Write data are provided to the memory array 502 through a data input circuit 544 and the memory array read/write circuitry 530.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
   a power regulator circuit configured to receive a first voltage and to generate a second voltage using the first voltage, wherein the second voltage is less than the first voltage, wherein the power regulator circuit is further configured to generate a third voltage equal to the second voltage subtracted from the first voltage using current mirroring; and
   an output buffer configured to provide an output signal based on an input signal based on the second voltage and the third voltage.

2. The apparatus of claim 1, wherein a transistor of the power regulator circuit is configured to operate at a voltage differential that is equal to or less than the second voltage.

3. The apparatus of claim 1, wherein the power regulator circuit comprises:
   a first voltage regulator configured to provide the second voltage based on the first voltage; and
   a second voltage regulator configured to provide the third voltage based on the first voltage and the second voltage.

4. The apparatus of claim 3, wherein the first voltage regulator comprises a direct current to direct current voltage regulator.

5. The apparatus of claim 4, wherein the second voltage regulator comprises:
   a reference circuit configured to provide an output reference voltage that is equal to a difference of the first and second voltages; and
   a power circuit configured to provide the third voltage based on the output reference voltage.

6. The apparatus of claim 5, wherein the reference circuit comprises:
   a first circuit coupled between an output of the first voltage regulator and a reference source configured to provide the output reference voltage; and
   a second circuit coupled between an output node and a first source configured to provide the first voltage, wherein the first circuit is matched with the second circuit, wherein the reference circuit is further configured to mirror a current of the first circuit through the second circuit.

7. The apparatus of claim 6, wherein the first circuit includes a first transistor coupled in series with a second transistor between the output of the first voltage regulator and the reference source, wherein a gate of the second transistor is coupled to the reference source and a gate of the first transistor is coupled to the drain of the first transistor, wherein the second circuit includes a third transistor coupled in series with a fourth transistor between the first source and the output node, wherein a gate of the fourth transistor is coupled to the output node and a gate of the first transistor is coupled to the drain of the third transistor.

8. The apparatus of claim 7, wherein the reference circuit further comprises a fifth transistor including a source coupled to the output of the first voltage regulator and a gate coupled to the gate of the first transistor to mirror the current through the first transistor.

9. The apparatus of claim 8, wherein the reference circuit further comprises a sixth transistor including a source coupled to the first source and a gate coupled to the gate of the third transistor to mirror the current through the third transistor.

10. The apparatus of claim 9, wherein the reference circuit further comprises:
    a seventh transistor including a drain coupled to a drain of the sixth transistor and including a source coupled to the reference source, wherein a gate of the seventh transistor is coupled to the drain of the seventh transistor; and
    an eighth transistor including a drain coupled the drain of the fifth transistor and including a source coupled to the reference source, a gate of the eighth transistor coupled to the gate of the seventh transistor to mirror the current through the seventh transistor.

11. The apparatus of claim 10, wherein the reference circuit further comprises a ninth transistor including a drain coupled to the output node and including a source coupled to the reference source, wherein a gate of the ninth transistor is coupled to the drain of the fifth transistor to provide feedback to the second circuit.

12. The apparatus of claim 11, wherein the reference circuit further comprises:
    a tenth transistor coupled between the output node and the ninth transistor to form a first cascode driver with the ninth transistor, wherein a gate of the tenth transistor is coupled to the output of the first voltage regulator; and
    an eleventh transistor coupled between the drain of the sixth transistor and a drain of the seventh transistor to form a second cascode driver with the sixth transistor, wherein a gate of the eleventh transistor is coupled to the output node.

13. The apparatus of claim 11, wherein the reference circuit further comprises:
- a first capacitor coupled between the first source and the output node to form a tank circuit; and
- a second capacitor coupled between the output node and the drain of the fifth transistor to provide a stable frequency response.

14. A method, comprising:
- receiving a first voltage at a power regulator circuit of an integrated circuit device;
- generating a second voltage using the first voltage, wherein the second voltage is less than the first voltage;
- subtracting the second voltage from the first voltage to provide a third voltage; and
- providing an output signal from an output buffer of the integrated circuit device based on an input signal using the first, second, and third voltages.

15. The method of claim 14, wherein subtracting the second voltage from the first voltage to provide the third voltage comprises mirroring a current of a first circuit of the power regulator circuit through a second circuit of the power regulator circuit.

16. The method of claim 15, wherein subtracting the second voltage from the first voltage to provide the third voltage further comprises:
- providing an output reference voltage using the current through the second circuit wherein the output reference voltage is equal to the third voltage; and
- providing the third voltage from the second circuit having a higher current capacity than the output reference voltage.

17. The method of claim 16, wherein providing the third voltage from the second circuit having a higher current capacity than the output reference voltage is via a current multiplier.

18. The method of claim 15, further comprising operating circuitry of the first circuit at a voltage differential equal to or less than the second voltage.

19. The method of claim 14, providing the output signal from the output buffer comprises:
- providing one of the third voltage and the first voltage to a first transistor of the output buffer based on the input signal; and
- providing one of the second voltage and the reference voltage to a second transistor of the output buffer based on the input signal.

20. The method of claim 19, further comprising:
- providing the third voltage to a third transistor of the output buffer; and
- providing the second voltage to a fourth transistor of the output buffer.

* * * * *